United States Patent [19]

Kimata et al.

[11] Patent Number: 4,831,426
[45] Date of Patent: May 16, 1989

[54] SOLID STATE IMAGE SENSING DEVICE AND A METHOD OF MANUFACTURING THE SAME

[75] Inventors: Masafumi Kimata; Masao Yamawaki; Sotoju Asai, all of Itami, Japan

[73] Assignee: Mitsubishi Denki Kabushiki Kaisha, Tokyo, Japan

[21] Appl. No.: 890,518

[22] Filed: Jul. 30, 1986

[30] Foreign Application Priority Data

Aug. 13, 1985 [JP] Japan .................. 60-179650

[51] Int. Cl.$^4$ ............................................. A01L 29/78
[52] U.S. Cl. .................................................. 357/24
[58] Field of Search .......................................... 357/24

[56] References Cited

FOREIGN PATENT DOCUMENTS 60-62154 9/1983 Japan .

OTHER PUBLICATIONS

Ishihara et al. *Interline CCD Image Sensor with an Anti-blooming Structure*, IEEE Transactions on Electron Devices, vol. ED-31, No. 1, Jan. 1984; 83-88.

V. L. Rideout, *Polysilicon-Gate DMOSFET with Low Resistance Diffused Interconnection Lines*, IBM Technical Disclosure Bulletin, vol. 21, No. 3, Aug. 1978; 1264-1267.

"An Interline-Transfer CCD Imager with Floating Photodiodes", S. Miyatake et al., IEDM Digest of Technical Papers 1980, pp. 342-345.

"A Zigzag-Transfer CCD Imager", H. Matsumoto et al., ISSCC, Digest of Technical Papers 1978, pp. 28-29.

Primary Examiner—Robert S. Macon
Attorney, Agent, or Firm—Lowe, Price, LeBlanc, Becker & Shur

[57] ABSTRACT

Diffusion self-aligned MOS transistors are applied to a solid state image sensing device so as to form in a self-alignment manner control regions (80) in which reading of signal charges from photosignal detecting regions (70) formed on a semiconductor (1) to charge transfer regions (30) is controlled.

3 Claims, 3 Drawing Sheets

SOLID STATE IMAGE SENSING DEVICE AND A METHOD OF MANUFACTURING THE SAME

BACKGROUND OF THE INVENTION

1. Field of the Invention

The present invention relates to a solid state image sensing device, and more particularly, it relates to the structure of regions for controlling reading of signal charges in a solid state image sensing device employing charge-coupled devices as means for reading the signal charges.

2. Description of the Prior Art

A solid state image sensing device is provided with photoelement arrays formed by a number of photodiodes or the like to sequentially read signal charges stored in the respective photoelements in response to the amount of incident light thereby to extract picture signals. For example, "An Interline-Transfer CCD Imager with Floating Photodiodes" by S. Miyatake et al., IEDM "Digest of Technical Papers" 1980, pp. 342-345 discloses a solid state image sensing device which controls transfer gates and gates of CCDs by common gate electrodes FIG. 1 is a sectional view showing a single cell of a conventional solid state image sensing device of an interline transfer system, and FIGS. 1A and 1B are potential diagrams thereof. Referring to FIG. 1, description is now made on the structure of the conventional solid state image sensing device. In the solid state image sensing device of the interline transfer system, photosensitive parts are formed by photodiodes, MOS transistors or the like, while storage parts are formed by charge-coupled devices (CCDs) vertically aligned in a parallel manner to the photosensitive parts.

Referring to FIG. 1, a single cell of the solid state image sensing device includes a semiconductor substrate 1, isolation regions 2 prepared by highly concentrated impurity regions identical in conductivity type to the semiconductor substrate 1, buried channel type vertical CCDs formed by impurity regions 3 different in conductivity type from the semiconductor substrate 1, transfer gates formed by ion implantation layers 4 identical in conductivity type to the semiconductor substrate 1, gate electrodes 5 for the vertical CCDs, shielding films 6 for preventing light from entering the vertical CCDs, photodetectors 70 formed by PN junction of the semiconductor substrate 1 and highly concentrated impurity regions 7 different in conductivity type from the semiconductor substrate 1 and an insulator film 9 provided on the semiconductor substrate 1.

Description is now briefly made on a method of manufacturing the conventional solid state image sensing device as shown in FIG. 1.

The isolation regions 2 are first formed in the semiconductor substrate 1. Then the buried channels 3 are formed in the surface layer of the semiconductor substrate 1 in portions adjacent to the isolation regions 2. Thereafter the transfer gates 4 are formed in the surface layer of the semiconductor substrate 1 in portions adjacent to the buried channels 3. Then an insulator film 9 is formed on the surface of the semiconductor substrate 1. Thereafter the gate electrodes 5 are formed on the insulator film 9 to cover the isolation regions 2, the buried channels 3 and the transfer gates 4. The gate electrodes 5 are formed through use of masks, which are so correctly registered as to align the edge 51 of each gate electrode 5 as formed with the edge 41 of each transfer gate 4. Then ion implantation is performed by utilizing the gate electrodes 5 as masks, to form the impurity regions 7. Thereafter the insulator film 9 is formed on the gate electrodes 5, an finally the shielding films 6 are formed on the same.

With reference to FIGS. 1, 1A and 1B, description is now made on the operation of the conventional solid state image sensing device. FIG. 1A shows a state of storing signal charges and FIG. 1B shows a state of reading the signal charges. In the state as shown in FIG. 1A, the transfer gates 4 and the gates of the vertical CCDs are controlled by common gate electrodes 5, and in response to clock signals $\phi_V$ supplied to the gate electrodes 5, the channel potentials under the transfer gates 4 flow back and forth between $\phi_T(L)$ and $\phi_T(H)$ while those under the vertical CCDs flow back and forth between $\phi_C(L)$ and $\phi_C(H)$. During this period, the photodetectors 70 are at potentials lower than $\phi_T(H)$, and hence no signal charge $Q_{sig}$ is read on the gates of the vertical CCDs.

In the reading state a shown in FIG. 1B, the potentials of the gate electrodes 5 are at "HH" levels higher than the "H" levels in the storage state, and hence the signal charges stored in the photodetectors 70 are read in the gates of the vertical CCDs.

"A Zigzag-Transfer CCD Imager" by H. Matsumoto et al., ISSCC "Digest of Technical Papers" 1978, pp. 28-29 discloses a solid state image sensing device which controls transfer gates and the gates of CCDs by common gate electrodes similarly to the aforementioned solid state image sensing device. In the said solid state image sensing device, potential difference between the transfer gates and the gates of the CCDs is realized by changing thickness of an oxide film.

In the conventional solid state image sensing device employing the CCDs as hereinabove described, the threshold voltage of the transfer gates for controlling reading of signal charges must be set at such a level that no signal charge is read in states other than the reading state. In order to form transfer gates having such threshold voltage, however, it has generally been necessary to correctly register the masks and selectively implant ions into regions for forming the transfer gates. Thus, the conventional solid state image sensing device has been deteriorated in performance by misregistration of the masks. In addition, it has been required to further improve accuracy of registration of the masks in order to miniaturize the solid state image sensing device.

SUMMARY OF THE INVENTION

The principal object of the present invention is to provide a solid state image sensing device in which transfer gates having prescribed threshold voltage are formed, in a self-alignment manner, without utilizing masks, and a method of manufacturing the same.

In the solid state image sensing device according to t the present invention, applied are diffusion self-aligned type MOS transistors (hereinafter referred to as DSA-MOS transistors) disclosed in Supplement of "Journal of Japan Society of Applied Physics" 1970, Vol. 39, p. 105, to form in a self-alignment manner control regions in which reading of signal charges from photosignal detecting regions formed on a semiconductor substrate to charge transfer regions is controlled by utilizing gate electrodes as masks.

According to the present invention, the control regions are formed in a self-alignment manner with respect to the gate electrodes, thereby to remove necessity for masks requiring registration and overcome the problem of accuracy in registration. Further, the solid state image sensing device according to the present invention is stabilized in performance.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 2:
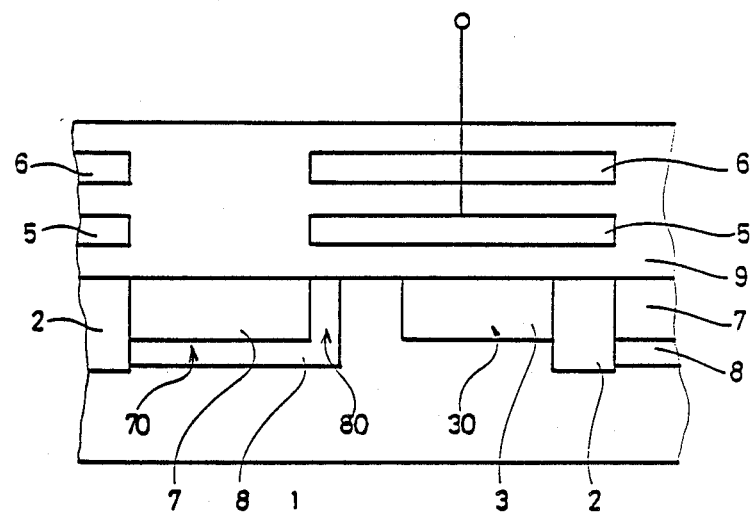
FIG. 2 is a sectional view showing the structure of a solid state image sensing device according to an embodiment of the present invention.

FIG. 2 is a sectional view showing the structure of a solid state image sensing device according to an embodiment of the present invention. Referring to FIG. 2, the solid state image sensing device of the present invention includes a semiconductor substrate 1, isolation regions 2, impurity regions 3, 7 and 8, gate electrodes 5, shielding films 6 and an insulator film 9. The semiconductor substrate 1 is prepared by, e.g., a P-type substrate and the isolation regions 2 are prepared by highly concentrated impurity regions of, e.g., P type. The impurity regions 7 are prepared by highly concentrated impurity regions of, e.g., N type to be in PN junction with the impurity regions 8 thereby to form photodetecting regions 70. The impurity regions are prepared by, e.g., N-type regions to serve as charge transfer regions for transferring signal charges. The impurity regions 3 form buried channel type vertical CCDs 30. The gate electrodes 5 are adapted to control reading of signal charges from the photosignal detecting regions 70 to the vertical CCDs 30. The impurity regions 8 are prepared by highly concentrated regions of, e.g., P type and include the control regions 80 to be employed as transfer gates having prescribed threshold voltage, in which reading of the signal charges is controlled.

Figure 1:
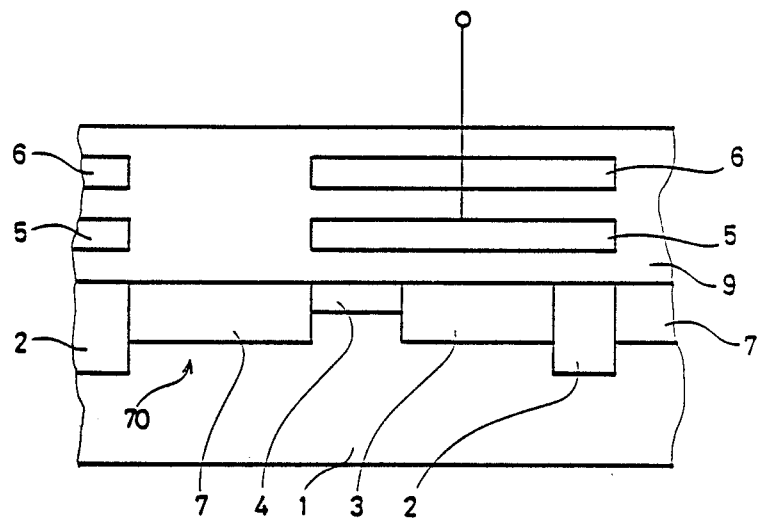
FIG. 1 is a sectional view showing the structure of a conventional solid state image sensing device.
Figure 1A:
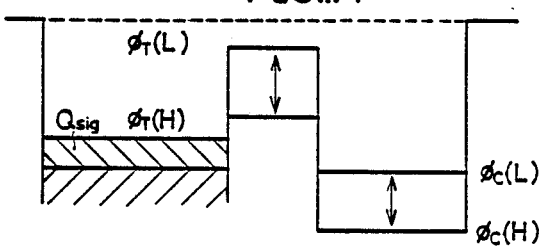
FIGS. 1A and 1B illustrate potentials of respective regions as shown in FIG. 1.
Figure 1B:
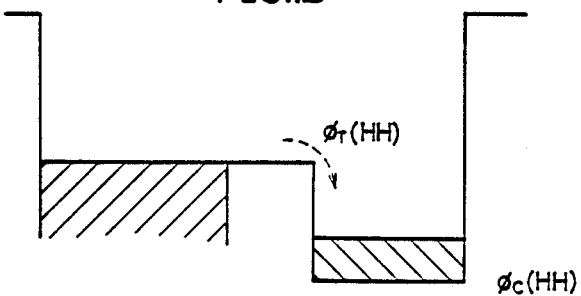

The operation of the solid state image sensing device as shown in FIG. 2 is similar to that of the conventional device as hereinabove described with reference to FIGS. 1A and 1B, and hence detailed description thereof is omitted.

Figure 2A:
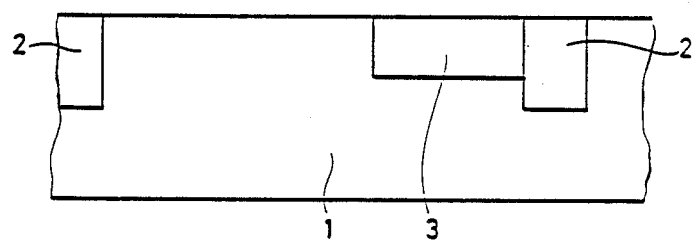
FIGS. 2A to 2C illustrate steps of manufacturing the solid state image sensing device as shown in FIG. 2.
Figure 2B:
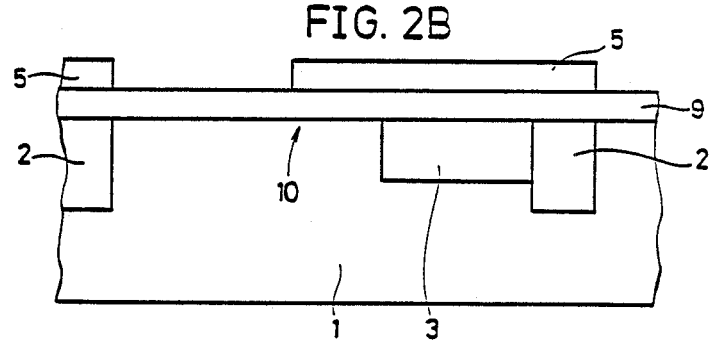
Figure 2C:
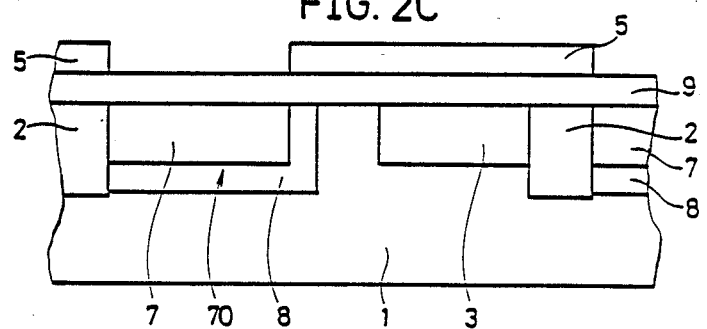

FIGS. 2A to 2C illustrate a method of manufacturing the solid state image sensing device as shown in FIG. 2. Referring to FIGS. 2A to 2C, description is now made on the method of manufacturing the solid state image sensing device according to the present invention.

As shown in FIG. 2A, isolation regions 2 prepared by highly concentrated regions of, e.g., P type are formed in a semiconductor substrate 1 of, e.g., P type. Then buried channels 3 of, e.g., N type are formed on the surface of the semiconductor substrate 1 in portions adjacent to the isolation regions 2.

Then, as shown in FIG. 2B, an insulator film 9 is provided on the semiconductor substrate 1, to form gate electrodes 5 on the isolation regions 2, the buried channels 3 and regions 10 of the semiconductor substrate 1.

Then, as shown in FIG. 2C, the gate electrodes 5 are employed as masks to perform ion implantation of impurities to form highly concentrated impurity regions 8 of, e.g., P type, and thereafter the gate electrodes 5 are again employed as masks to perform ion implantation of impurities thereby to form highly concentrated impurity regions 7 of, e.g., N type. Thus, according to the present invention, the impurity regions 8 serving as control regions are extended to cover the lower surfaces of the impurity regions 7 which are in PN junction with the impurity regions 8 to form photosignal detecting regions 70.

In the solid state image sensing device according to the present invention, the photodetectors 70 serve as sources of transistors in reading operation while vertical CDDs 30 effectively serve as drains thereof, whereby the control regions for signal charges are provided in the form of DSA-MOS transistors in the structure as shown in FIG. 2. The DSA-MOS transistors are provided in source areas thereof with highly concentrated regions identical in conductivity type to the semiconductor substrate, so as to determine the threshold voltage by the maximum concentration value of the highly concentrated regions. Therefore, desired threshold voltage can be obtained by controlling the amount of ion implantation and heat treatment.

As hereinabove described, the impurity regions 8 can be formed in a self-alignment manner without utilizing masks, whereby the solid state image sensing device can be easily manufactured with no inuniformity of characteristics caused by misregistration of masks. Further, the DSA-MOS transistors can advantageously attain conductance higher than that of an ordinary MOS transistor.

Although the isolation regions in PN junction isolation are employed for isolating the elements in the aforementioned embodiment, the same may be replaced by thick oxide films or formed through selective oxidation. Further, although the impurity regions 8 are provided to entirely cover the lower surfaces of the impurity regions 7, the same may partially cover the said lower surfaces.

In case where well structure is employed for blooming and smear control etc. the semiconductor substrate 1 may be differed in conductivity type from that of the above embodiment and the wells may be made identical in conductivity type to the semiconductor substrate 1, thereby to attain structure similar to the above.

Although the present invention has been described and illustrated in detail, it is clearly understood that the same is by way of illustration and example only and is not to be taken by way of limitation, the spirit and scope of the present invention being limited only by tee terms of the appended claims.

What is claimed is:

1. A solid state image sensing device comprising:
a semiconductor substrate (1) of a first conductivity type;
photosignal detecting regions (70) formed in the surface of said semiconductor substrate (1) for detecting photosignals;
charge transfer regions (30) of a second conductivity type formed in the surface of said semiconductor substrate (1) with intervals from said photosignal detecting regions (70) for transferring signal charges;
gate electrodes (5) formed over said charge transfer regions (30) and over regions between said photosignal detecting regions (70) and said charge transfer regions (30) through an insulator film (9) for controlling reading of signal charges from said photosignal detecting regions (70) to said charge transfer regions (30); and control regions (80) of a first conductivity type and having a larger impurity concentration than that of said semiconductor substrate (1) formed in contact with said photosignal detecting regions (70) and with intervals from said charge transfer regions (30) so that said reading of said signal charges is performed by said gate electrodes (5).

2. A solid state image sensing device in accordance with claim 1, wherein said control regions (80) are formed to be in contact with at least parts of the lower surfaces of said photosignal detecting regions (70).

3. A method of manufacturing a solid state image sensing device having a semiconductor substrate (1) of a first conductivity type, said method comprising:

a first step of forming charge transfer regions (30) of a second conductivity type on the surface of said semiconductor substrate (1) of said first conductivity type for transferring signal charges;

a second step of forming an insulator film (9) on the surface of said semiconductor substrate (1);

a third step of forming gate electrodes (5) in regions of said semiconductor substrate (1) including said charge transfer regions (30) on said insulator film (9);

a fourth step of ion-implanting impurities in regions of said semiconductor substrate (1) of said first conductivity type by utilizing said gate electrodes (5) as masks thereby to form impurity regions (8) of the first conductivity type having a larger impurity concentration than said semiconductor substrate (1) adapted to form control regions (80) in which reading of signal charges is performed by said gate electrodes (5); and a fifth step of performing ion implantation into said impurity regions (8) by employing said gate electrodes (5) as masks thereby to form highly concentrated impurity regions of said second conductivity type of form boundary photosignal detecting regions (70) for detecting photosignals.

* * * * *